(12) United States Patent
Bouchet (10) Patent No.: US 11,157,673 B2
(45) Date of Patent: Oct. 26, 2021

(54) FIELD PROGRAMMABLE GATE ARRAY (FPGA) HAVING DISSIMILAR CORES

(71) Applicant: RATIER-FIGEAC SAS, Figeac (FR)

(72) Inventor: Arnaud Bouchet, Planioles (FR)

(73) Assignee: RATIER-FIGEAC SAS, Figeac (FR)

( * ) Notice: Subject to any disclaimer, the term of this patent is extended or adjusted under 35 U.S.C. 154(b) by 0 days.

(21) Appl. No.: 16/715,379

(22) Filed: Dec. 16, 2019

(65) Prior Publication Data

US 2021/0012052 A1  Jan. 14, 2021

(30) Foreign Application Priority Data

Jul. 12, 2019 (EP) ..................... 19290054

(51) Int. Cl.
*G06F 30/347* (2020.01)
*G06F 30/392* (2020.01)

(52) U.S. Cl.
CPC .......... *G06F 30/347* (2020.01); *G06F 30/392* (2020.01)

(58) Field of Classification Search
CPC .. G06F 30/347; G06F 30/392; G06F 11/0796; G06F 17/00; H04W 76/18; H04W 76/20; H04W 84/20; H04W 8/08
See application file for complete search history.

(56) References Cited

U.S. PATENT DOCUMENTS

| | | | | |
|---|---|---|---|---|
| 6,199,031 | B1 * | 3/2001 | Challier | G06F 30/33 703/14 |
| 7,313,730 | B1 * | 12/2007 | Ryser | G06F 11/2236 714/25 |
| 7,966,590 | B2 * | 6/2011 | Kanazawa | G06F 30/30 716/104 |
| 8,046,727 | B2 | 10/2011 | Solomon | |
| 8,301,867 | B1 * | 10/2012 | Mazuk | G06F 11/2005 712/36 |
| 9,915,520 | B2 * | 3/2018 | Cable | H01S 5/426 |
| 9,916,247 | B2 | 3/2018 | Steinmacher-Burow | |
| 9,971,910 | B2 * | 5/2018 | Kling | G06F 21/74 |
| 10,248,430 | B2 | 4/2019 | Noll et al. | |
| 10,289,792 | B1 * | 5/2019 | Chow | G06F 30/394 |
| 2017/0373953 | A1 * | 12/2017 | George | H04L 43/04 |
| 2018/0293709 | A1 * | 10/2018 | Zhang | G06T 5/10 |
| 2019/0047723 | A1 | 2/2019 | Mielzarek et al. | |
| 2019/0049912 | A1 * | 2/2019 | Poornachandran | G05B 19/0421 |

(Continued)

FOREIGN PATENT DOCUMENTS

| | | | | |
|---|---|---|---|---|
| CN | 103403701 | A * | 11/2013 | G06F 1/26 |
| CN | 106462465 | A * | 2/2017 | G06F 1/3206 |

(Continued)

OTHER PUBLICATIONS

European Search Report for Application No. 19290054.6, dated Jan. 27, 2020, 7 pages.

*Primary Examiner* — Helen Rossoshek
(74) *Attorney, Agent, or Firm* — Cantor Colburn LLP (57) ABSTRACT

A field programmable gate array (FPGA) having at least first and second processing circuits implemented thereon. Each of the first and second processing circuits comprises a numerical core and associated peripheral components. The numerical core in the first processing circuit is dissimilar to the numerical core in the second processing circuit. The first and second processing circuits are segregated from each other in floorplan view.

11 Claims, 3 Drawing Sheets

(56) References Cited

U.S. PATENT DOCUMENTS

| | | |
|---|---|---|
| 2019/0079826 A1 | 3/2019 | Gianisis et al. |
| 2019/0108585 A1* | 4/2019 | Caldwell ................ G06N 20/00 |
| 2019/0188093 A1 | 6/2019 | Eckelmann-Wendt et al. |
| 2019/0228666 A1* | 7/2019 | Lassini ................ G05D 1/0088 |

FOREIGN PATENT DOCUMENTS

| | | | | |
|---|---|---|---|---|
| CN | 110998487 A | * | 4/2020 | ........... G06F 1/3296 |
| EP | 2533154 B1 | | 12/2012 | |
| EP | 3336647 A1 | | 6/2018 | |
| GB | 2446422 A | * | 8/2008 | ............... G06F 8/44 |

* cited by examiner

A / B structure

Fig. 3

Cross monitoring

Fig. 4

FIELD PROGRAMMABLE GATE ARRAY (FPGA) HAVING DISSIMILAR CORES

FOREIGN PRIORITY

This application claims priority to European Patent Application No. 19290054.6 filed Jul. 12, 2019, the entire contents of which is incorporated herein by reference.

FIELD OF THE INVENTION

The subject matter disclosed herein generally relates to Field Programmable Gate Arrays (FPGAs), and, in embodiments, their application in avionics, in particular for use in aircraft control systems.

BACKGROUND

Aircraft control systems typically include a plurality of processing circuits that may be arranged, for instance, to monitor the operating conditions of the aircraft and to communicate signals to actuate various sub-systems of the aircraft accordingly. Aircraft control systems thus typically comprise various numerical (processing) cores used to perform the calculations necessary to monitor and control the functioning the aircraft. Such numerical cores are commonly implemented on Field Programmable Gate Arrays (FPGAs).

Failure in an aircraft control system can result in catastrophic failure of the functioning of an aircraft, so it is important that every measure is taken to ensure that the failure of any component of an aircraft control system can be avoided where possible. However, if failure of a component does occur the system needs to be able to continue to function effectively.

Accordingly, aviation authorities set forth strict safety requirements for aircraft control systems. For instance, it is generally required to have multiple (redundant) processing circuits for each processing channel. For example, each channel may typically include an active controller for managing signals on the processing channel and a monitoring controller that monitors the operations of the active controller (e.g. channel monitoring). Generally, it is also required that the controllers on each channel are different from each other, or "dissimilar". Various degrees of dissimilarity may be specified, e.g. depending on the system and level of criticality safety required.

Thus, it can be difficult when designing safety architectures for use in such aircraft control systems to simultaneously address these requirements and the Applicants believe that there is room for improvement in this regard.

SUMMARY

An embodiment of the present disclosure provides a field programmable gate array (FPGA) having at least first and second processing circuits implemented thereon, wherein each of the first and second processing circuits comprises a numerical core and associated peripheral components, wherein the numerical core in the first processing circuit is dissimilar to the numerical core in the second processing circuit, and wherein the first and second processing circuits are segregated from each other in floorplan view.

Thus, a (single) FPGA is provided having plural processing circuits implemented thereon, with each of the processing circuits comprising a numerical core and associated peripheral (e.g. input/output) components. The numerical cores of the different processing circuits are dissimilar (different) to each other. For instance, the numerical core of the first processing circuit may have a first logic, and the numerical core of the second processing circuit may have a second, different logic.

The above arrangement provides an improved architecture (layout) wherein the requirements for ensuring and showing dissimilarity of the different processing cores can readily be met, since the processing circuits are entirely segregated in floorplan view, but using the same base FPGA and therefore allowing the number of components to be reduced, thereby potentially simplifying the design process.

In some embodiments the FPGA only has the first and second processing circuits implemented thereon. That is, the FPGA may be a dual-core FPGA. However, it is also contemplated that the FPGA may have other processing circuits and/or numerical cores implemented thereon, as desired, which may (or may not) be dissimilar with the first and second processing circuits.

In embodiments, the processing circuits are segregated such that the processing circuits do not share any (core or peripheral) components. Each processing circuit may thus have its own associated input/output interfaces. For instance, each processing circuit may generally comprise any one more of: (i) a serial interface; (ii) an external memory interface; (iii) an external bus interface; (iv) a general purpose input/output module; and (v) a power bridge controller.

In embodiments, communication between the first and second processing circuits is made externally to the FPGA. Thus, in embodiments, the first and second processing circuits can (only) communicate via a communications line connected externally to the FPGA. For instance, each of the processing circuits may comprise an inter-core communication module that is configured to facilitate communications with the other processing circuit via an external communications line.

Thus, in embodiments, the first and second processing circuits are segregated such that there is no internal communication between the circuits on the FPGA.

In general, the numerical cores in the first and second processing circuits may independently either be hard or soft coded. In some embodiments, the first processing circuit includes a soft numerical core, and the second processing circuit includes a hard coded numerical core. In other embodiments, the first and second processing circuit may both include a soft numerical core.

The FPGA may generally be implemented on a single substrate, e.g. a silicon chip. The first and second processing circuits may thus be implemented on different areas of the substrate defining the FPGA.

In embodiments, a monitoring system is provided comprising one or more FPGA(s) as described herein.

In embodiments, an aircraft flight control system is provided comprising a monitoring system or one or more FPGA(s) as described herein.

The present disclosure also relates to methods of operating an FPGA according to any of the embodiments described herein. Thus, another embodiment relates to a method of operating an FPGA comprising: providing an FPGA having at least first and second processing circuits implemented thereon, wherein each of the first and second processing circuits comprises a numerical core and associated peripheral components, wherein the numerical core in the first processing circuit is dissimilar to the numerical core in the second processing circuit, and wherein the first and second processing circuits are segregated from each other in floorplan view; transmitting data to at least one of the numerical cores; for each numerical core to which data has been transmitted, performing an operation using the numerical core independently of the at least one other numerical core; and outputting data from each numerical core to which data has been transmitted.

The data transmitted to the core(s) may be sensor data, for example, comprising one or more sensor measurement(s). The sensed parameter can thus be monitored using the FPGA. The output data may therefore represent a result of the monitoring. The output data may also comprise a signal for controlling an actuator accordingly based on such monitoring. Various other arrangements would be possible.

Also provided is a method of designing and/or manufacturing an FPGA according to any of the embodiments described herein. For instance, the method may comprise providing a first processing circuit comprising a first numerical core and associated peripheral components; providing a second processing circuit comprising a second numerical core and associated peripheral components, wherein the second numerical core is dissimilar to the first numerical core; and arranging (e.g. routing and placing) the first and second processing circuits on the FPGA such that the first and second processing circuits are segregated from one another in floorplan view.

BRIEF DESCRIPTION OF FIGURES

Various arrangements and embodiments will now be described, by way of example only, and with reference to the accompanying drawings, in which.

DETAILED DESCRIPTION

A Field Programmable Gate Array (FPGA) is an integrated circuit that is designed to be configured by a designer after manufacturing. An FPGA comprises a number of configurable logic blocks (CLBs) which can be interconnected with one another via a number of reconfigurable (or programmable) interconnects. An array of such CLBs thus creates a flexible computing fabric, which can be (re) configured by the designer, for example by "wiring together" the CLBs in different configurations. The FPGA thus provides a programmable substrate onto which processing circuits can be implemented and executed at relatively high speeds.

Due to their combination of performance and flexibility, FPGAs are therefore commonly used in critical systems, such as aircraft control systems, and the like. For instance, FPGAs typically have relatively faster manufacturing cycles, cheaper design costs, and support longer life cycles in comparison with other Programmable Logic Devices (PLDs), making them particularly suited to for the development and implementation of circuits for flight control systems. However, the present disclosure may of course also find utility in other systems, for example vehicle control systems, medical systems, nuclear systems, or any other critical systems in which it might be desirable to provide multiple dissimilar processing cores. Thus, whilst embodiments will be presented in the context of a flight control system, it will be understood that the present disclosure is not limited to this context.

A designer can implement a particular functionality on an FPGA by implementing a suitable intellectual property (IP) core (or "numerical core") on the FPGA, with the IP core then being interconnected with various peripheral components on the FPGA to allow it to function and interact with external parts of the system within which the FPGA is employed. An IP core is a reusable layout design with a defined interface and behaviour (verified by the supplier) that can therefore be used as a building block for an FPGA logic design.

These IP cores can generally be characterised as either "soft" cores or "hard" cores. A soft core can be provided in the form of a "netlist" (a list of the logic gates and associated interconnections making up an integrated circuit) or a hardware description language (HDL). These provide a description of an electronic circuit which is then implemented by the designer onto the fabric of an FPGA. The functionality of a FPGA soft core can change upon every power-up of a device, giving the FPGA designer flexibility to update or change functionality without great cost or time.

By contrast, a hard core (also referred to as a "hard macro") is provided in the form of a physical circuit layout which cannot be modified by the designer. A hard core is restricted to the functionality of the manufacturer, and is similar to a black box in that it cannot be properly analysed or optimised.

In aircraft control systems in order to meet the relevant aviation standards it is often required to provide multiple dissimilar numerical cores for controlling/monitoring a particular processing channel (or task). These dissimilar cores may not all provide concurrent active output to control the actuations of mechanical components of an aircraft; for instance, one of the dissimilar numerical cores may monitor the functioning of an active core, to determine any deviation between the two, or alternatively may be inactive. However, regardless of the state of the dissimilar cores, by providing various dissimilar numerical cores configured to perform the same task, if one of the cores fail or functions erroneously as a result of the particular logic of that core then the other cores can continue to function unaffected, or can signal that the core has failed, and so on.

Figure 1:
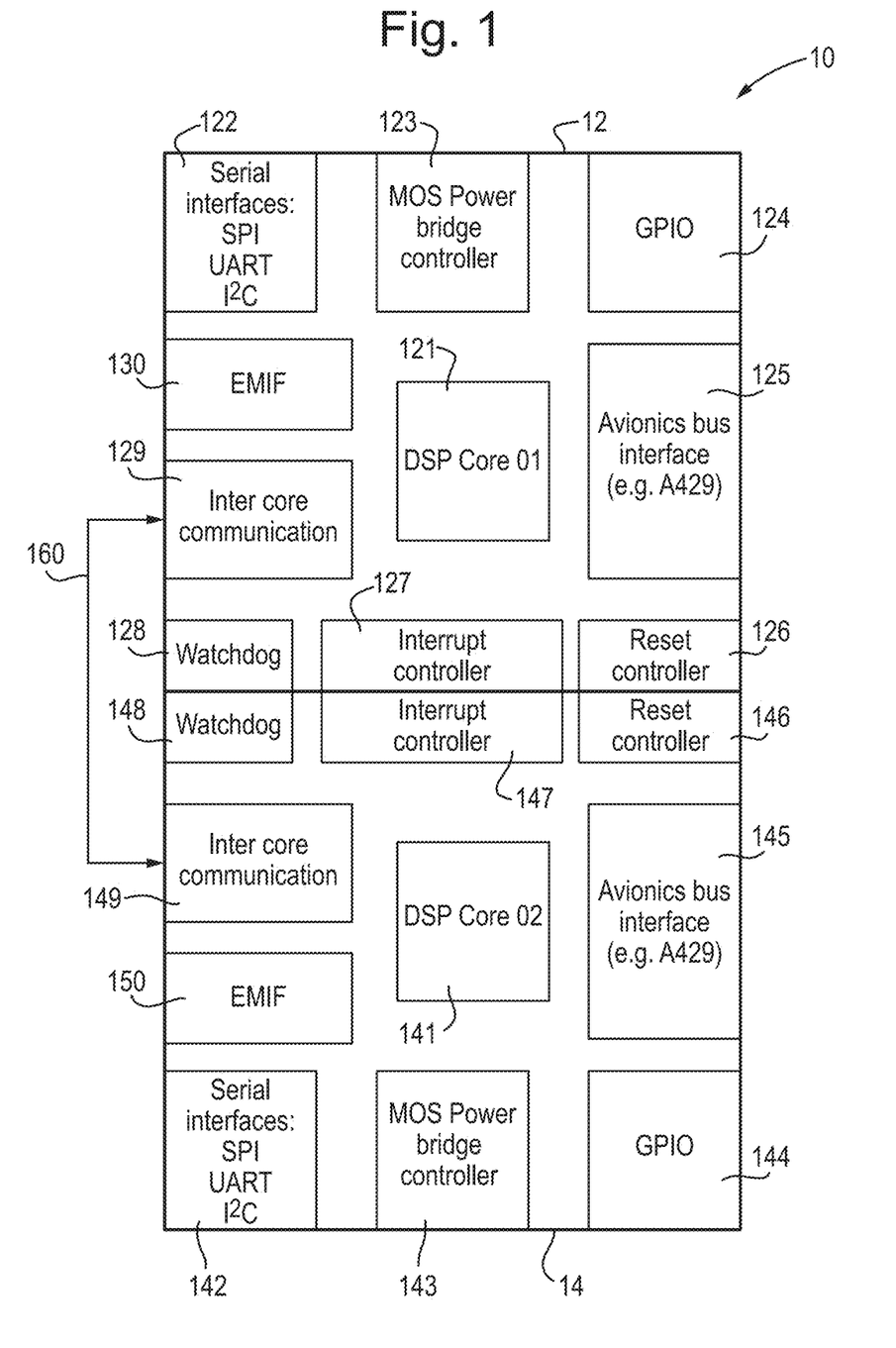
FIG. 1 shows schematically an example of a dual-core component architecture according to an embodiment.

According to embodiments of the present disclosure, these requirements may be satisfied by providing an FPGA architecture having a plurality of dissimilar (different) processing circuits implemented thereon, as shown for example in FIG. 1.

As shown in FIG. 1, the FPGA 10 is provided with a first processing circuit 12 and a second processing circuit 14. Each processing circuit 12, 14 comprises a numerical IP core 121, 141, as well as various associated peripheral devices (e.g. input/output interfaces) that may be necessary to allow the core 121, 141 to be implemented on the FPGA 10.

For example, as shown in the embodiment of FIG. 1, these peripheral devices may include any of a serial interface 122, 142 (e.g. SPI, UART, I2C), a metal-oxide-semiconductor (MOS) power controller 123, 143, a general purpose input/output (GPIO) 124, 144, an avionics bus interface 125, 145, a reset controller 126, 146, an interrupt controller 127, 147, a watchdog 128, 148, an inter-core communication module 129, 149, and an external memory interface (EMIF) 130, 150.

However, it will be appreciated that FIG. 1 merely shows one exemplary FPGA architecture and that according to the present disclosure each processing circuit 12, 14 may independently contain any other suitable components (and correspondingly need not contain the components shown in FIG. 1).

Also, whilst the first 12 and second 14 processing circuits in FIG. 1 include components that generally mirror each other, it will be appreciated that this need not be the case, and the layout for each processing circuit may independently take any form, as desired.

In the present embodiments the first and second processing circuits 12, 14 are segregated from one another on the FPGA 10 substrate in "floorplan" view. It will be understood by those skilled in the art that a "floorplan" is a schematic representation of the placement of the functional blocks for the FPGA with the floorplan thus representing the overall available area for the FPGA.

Thus, as shown in FIG. 1, each of the first and second processing circuits 12, 14 is retained within a separate, non-overlapping, physical region (area) of the FPGA 10 substrate. For instance, the FPGA 10 may comprise a planar substrate, such as a silicon chip, with each processing circuit 12, 14 falling into a distinct non-overlapping region (area) on the substrate such that there is no physical overlap between the processing circuits. There is thus no sharing of any circuitry components between processing circuits 12, 14. Each of the processing circuits 12, 14 therefore has its own numerical core, and its own respective peripheral components.

As shown in FIG. 1, the first 12 and second 14 processing circuits are configured to communicate with one another via a communication line 160 which is connected external to the FPGA 10. Each processing circuit 12, 14 thus comprises an inter-core communication module 129, 149 that is configured to facilitate communication with a corresponding inter-core communication component in a different processing circuit, via a communication means 160 which is external to the FPGA 10. A communication means external to the FPGA 10 is one which is not formed of or by components intrinsic to the FPGA 10. For example, the external communication means may be an external communication line 160 which is additional to the hardware of the FPGA 10. Any communications signals transmitted along a communication means external to the FPGA 10 can be said to have left the processing circuitry of the FPGA 10. Correspondingly, because all inter-core communication is external to the FPGA 10, there are no shared components or communications internal to the FPGA 10.

Using the external communication line 160 it is possible for a user to monitor signals transmitted between the segregated processing circuits. As such, as the only signals transmitted between the processing circuits are transmitted via external communication means 160, it is straightforward to demonstrate that one core 121 is functioning in isolation of the other core 141 on the FPGA 10, simply by observing the inter-core communication signals. This also advantageously allows the cores 121, 141 of the FPGA 10 of the present embodiments to be tested or assessed in isolation of one another. For instance, by ensuring that all inter-core communication is external to the FPGA 10, it is straightforward to demonstrate that the cores are independent of one another, and therefore satisfy the specified dissimilarity requirements.

As such, each of the processing circuits 12, 14 implemented on the same FPGA are able to operate independently of one another. In other words, the functioning of one of the processing circuits is dependent only on the processing circuitry segregated therein. Should any one of the cores or peripheral components of any one of the processing circuits fail, either for software or hardware reasons, then the continued effective function of the other processing circuits may be unaffected.

The processing circuits 12, 14 can thus be made dissimilar from one another. Further, this dissimilarity will be immediately apparent from inspection of the floorplan due to the physical segregation of the processing circuits 12, 14 described above. The FPGA 10 according to the present embodiments thus allows multiple different cores corresponding to different controllers to be implemented on the same FPGA, whilst still demonstrating the desired dissimilarity (e.g. due to the physical segregation of the processing circuits 12, 14).

Thus, the different processing circuits 12, 14 can be developed independently by different development teams, for example, to further ensure the desired dissimilarity. The programmable core logic development language and logical architectures used could differ between different teams. For example, one team may develop a soft core using VHSIC Hardware Description Language (VHDL), while the other team may develop a soft core using System C or Verilog.

That is, because all of the core resources for the processing circuits 12, 14 are segregated on the FPGA 10 in floorplan view, it is possible to ensure dissimilarity of the cores, whilst reducing the number of components and component suppliers.

For example, another approach to ensure the desired dissimilarity would be to implement each IP core on a different FPGA. Such an approach may be utilised in various conventional safety-critical systems. However, this approach would require additional components and also potentially different component suppliers to ensure the desired dissimilarity. This approach may therefore be relatively costly and require extensive development time.

It might also be possible to implement multiple soft cores on a common FPGA; however, typically in this case the FPGA would be laid out such that the cores shared at least some peripheral components such that a single circuitry component such as a GPIO would be configured to coordinate the input and output for all of the soft cores. Thus, in such arrangements, the processing circuits associated with each soft core would not be segregated in floorplan view the manner described herein. Any fault such as an electrical or manufacturing failure of the shared peripheral components may thus led to errors in both soft cores, and such arrangements may not therefore provide the required redundancy for safety-critical systems such as aircraft control systems. Thus, even though two soft cores would be implemented on the FPGA, another different FPGA would still be required to meet the strict requirements for the aircraft control system.

It will be appreciated that the (dissimilar) numerical cores of an aircraft control system may have to meet various certification requirements, e.g. depending on the level of criticality safety required for that control system. For instance, in some cases it may be required only that there is some difference between the cores. However, it may be required that there is a further "technological dissimilarity" between the cores, which implies that at least the base design elements of each numerical core should be different. It may also be required that there is a "physical dissimilarity" between the cores such that each numerical core must be implemented on a physically different component.

In some cases, where a very high level of criticality safety is needed (e.g. the highest level of safety), it may be required that there is both a strict technological and strong physical dissimilarity between the cores. In this case it may be desirable to use simply use two separate FPGAs (although this approach may be relatively expensive and time-consuming, as mentioned above).

However, in many other cases, it may be that the dissimilarity requirements are at least partly relaxed. For instance, in many situations it is not necessary to have both strict physical and technological dissimilarity between the different cores.

In contrast to the above approach, the present arrangement can thus provide a similar degree of isolation afforded by implementing different cores on different FPGAs using a single FPGA with segregated cores, thus allowing the desired dissimilarity requirements to be achieved, whilst also saving on weight and cost requirements, as well as simplifying the manufacturing requirements.

In embodiments, the FPGA may comprise a first processing circuit having a soft core, and a second processing circuit having a hard core. As discussed above, a hard core is provided in the form of a physical circuit layout, and cannot be modified by a designer once it has been purchased from a manufacturer. As such, the hard core has associated with it a physical structure separate from the original physical structure of the FPGA. This means that any fault which manifests in the original physical structure of the FPGA which may affect the soft core implemented in the fabric thereof (be it a manufacturing fault, a physical fault caused by stress on the original physical structure of the FPGA, or an electrical fault in the FPGA) is unlikely to affect the physical structure of the hard core, and vice versa. Accordingly, an FPGA comprising a hard core and a soft core may have an increased resistance to correlated failure of both the hard core and the soft core.

The use of different (hard/soft) types of core thus provides an additional degree of dissimilarity. For instance, implementing one soft core and one hard core on a single FPGA will provide a sufficient level of technological and routing dissimilarity for many applications (even though the cores in that FPGA will not meet the strictest physical separation requirements of being on different FPGAs).

Additionally, a hard core may be purchased with various peripheral components already thereon. An FPGA is also conventionally purchased having the various peripheral components thereon necessary to implement a soft core. As such, it may be possible to implement a soft core within a first processing circuit of an FPGA and a hard core within a second processing circuit of an FPGA without needing to add any additional peripheral components to either processing circuit.

It is therefore particularly straightforward and advantageous to produce an FPGA having segregated processing circuits in accordance with the present invention, in embodiments where the FPGA has a hard core and a soft core implemented thereon.

In other embodiments the FPGA may have two dissimilar soft cores implemented thereon. In that case dissimilarity may be ensured by appropriately segregating the soft cores, in the manner described above, such that the cores can be developed independently. In that case it may be necessary to add additional input/output modules onto the FPGA in order to ensure proper segregation (with no shared peripheral components). It will be appreciated that this arrangement generally provides a lower degree of dissimilarity compared to using hard/soft cores. However, the use of two soft cores then allows each of the cores to be maintained and updated during use, even after the FPGA has been installed into a system. The use of two soft cores may therefore provide additional design flexibility and the ability to repurpose the FPGA after installation. Further, this arrangement can still provide sufficient dissimilarity for many applications (i.e. those not requiring the strictest certification).

Embodiments of the present disclosure thus provide a solution to the issue of addressing different numerical core and/or manufacturers when dealing with dissimilarity requirements. For instance, when designing safety architecture, it may be difficult to find additional numerical core(s) and component supplier(s) to provide the desired dissimilarity. Conventionally therefore this implies multiplication of the development tools used for different components and sourcing components from multiple manufacturers.

By contrast, the present disclosure allows the number of components and associated manufacturers to be reduced whilst being able to demonstrate the dissimilarity in terms of numerical cores (using the same base FPGA), and introducing flexibility in terms of design (e.g. by customisation of the interfaces).

In particular, embodiments of the present disclosure provide dual dissimilar numerical cores (hardcoded or soft coded) in the same FPGA, segregated from floorplan point of view, and interconnected externally, while also integrating relevant peripheral interfaces.

This architecture can thus address software dissimilarity and hardware dissimilarity while possibly using the same component manufacturer, and integrating peripheral functions, thereby lowering the number of components needed on-board.

The cores can thus be addressed separately with separate input/output banks (and other peripheral components). The architecture presented herein can thus address an intermediate step between full dissimilarity (e.g. using different FPGAs from different suppliers) and using the same numerical core. In particular, it is possible to ensure sufficient dissimilarity in software without having the constraints to use dissimilar component suppliers.

This architecture can be used in various configurations. Some possible configurations will now be described by way of example. However, other arrangements would of course be possible.

Figure 2:
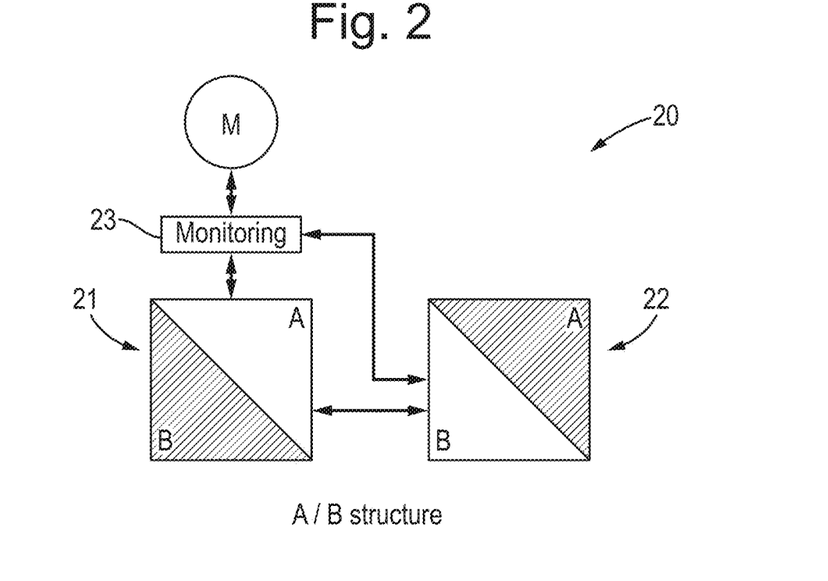
FIG. 2 shows an example configuration of a monitoring system using a plurality of such component architectures.

FIG. 2 shows a component architecture for a monitoring system 20 according to an embodiment of the present invention. The architecture comprises a first FPGA 21 in accordance with the present invention, having a first core with active logic A, and a second, dissimilar core with inactive logic B, each retained within respective processing circuits which are segregated from one another in floorplan view. The architecture also comprises a second corresponding FPGA 22, which is substantially similar to the first FPGA 21 except that the core with logic B is active, and the core with logic A is inactive. The active cores 21-A, 22-B on each FPGA are in communication with one another, as well as with a monitoring component 23, which communicates information regarding the monitoring with a component M. As such, data from component M, such as sensor measurements or operating conditions for a process, can be passed to the active cores 21-A, 22-B, which can then make determinations based on the data, and provide an output. The outputs from each active core 21-A, 22-B can be compared to one another by the monitoring component 23, and deviation between the outputs from the two active cores 21-A, 22-B can be detected. This arrangement thus allows two corresponding FPGAs in accordance with the present invention to be compared and assessed. Furthermore, as only one active core is being used on each FPGA, this architecture satisfies the certification requirement for strict physical dissimilarity.

Furthermore, the manufacture of the system can be simplified since both FPGAs 21, 22 may have the same construction, whilst still providing the required dissimilarity, e.g. by having different cores on the two FPGAs being active. For instance, the core pair 21-A and 22-B may provide both the required physical and technological dissimilarity, despite the fact that the FPGAs 21, 22 are substantially the same.

Figure 3:
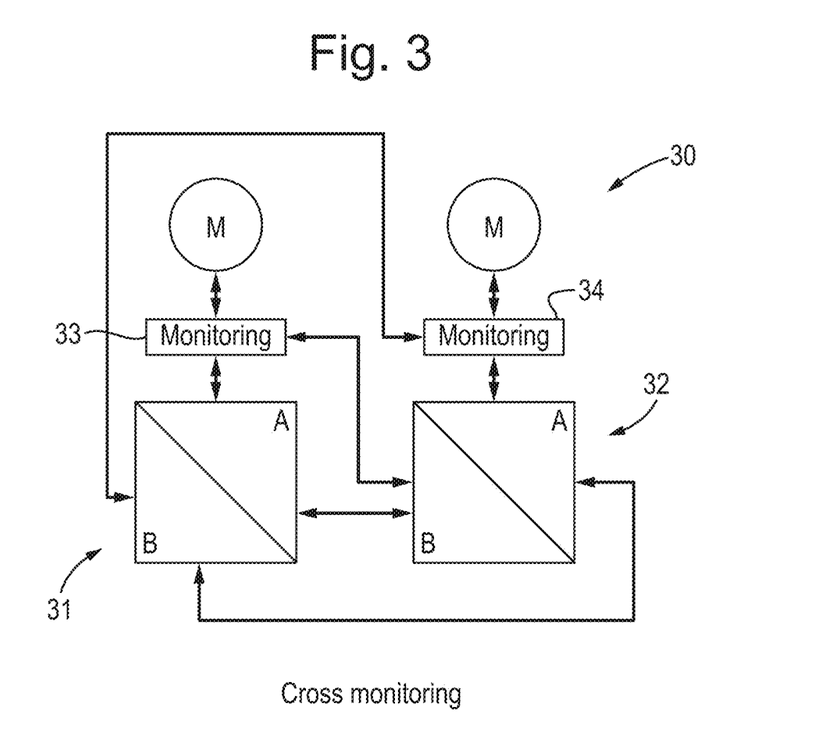
FIG. 3 shows a further example configuration of a monitoring system using a plurality of such component architectures.

The architecture can also readily be re-configured, e.g. by activating the other core(s). For instance, FIG. 3 shows a component architecture for a monitoring system 30 according to according to another embodiment of the present invention. The architecture comprises first and second FPGAs 31, 32, each similar to that described in regard to FIG. 2, however in this case both logic A and logic B are active on each of the FPGAs. The core comprising logic A on the first FPGA 31 is in communication with the core comprising logic B on the second FPGA 32, and both are also in communication with a first monitoring component 33. Correspondingly, the core comprising logic B on the first FPGA 31 is in communication with the core comprising logic A on the second FPGA 32, and again both are in communication with another monitoring component 34. Each monitoring component is connected to a respective component M. The two components M may be the same component or different components. As such, this architecture allows the cross monitoring and comparison of the functioning of logic A and B, so that even in the event that an entire FPGA is damaged by a severe localised event, a failure will be detectable and identifiable by comparison with both logic A and logic B of the other functioning FPGA. This enables a flexible dissimilar structure which, together with dissimilar applicative software, may provide a further degree of dissimilarity.

Where a high level of critical safety is needed, it may be required that there is both a strict technological and strong physical dissimilarity between cores which are monitoring the same component M. However, in some cases, the requirement of strong physical dissimilarity may be relaxed for cores which are monitoring different components, e.g. there may only need to be technological dissimilarity between cores monitoring different components.

In embodiments where the two components M correspond to different components, the architecture of FIG. 3 provides a monitoring system wherein the different components M may each be monitored by both logic A and logic B on two physically dissimilar and separate FPGAs. Accordingly, the requirements of both strict technological and strong physical dissimilarity are met for cores monitoring the same component M. In a conventional approach where both strong technological and strong physical dissimilarity is required between cores monitoring the same component, four separate FPGAs would be needed to monitor two different components. As such, this architecture provides a considerable reduction in cost and weight in comparison with a conventional approach, while still meeting the highest dissimilarity requirements for cores monitoring the same component M. While the cores monitoring different components do not meet the requirement of physical dissimilarity, in many cases this requirement is relaxed, as discussed above.

Figure 4:
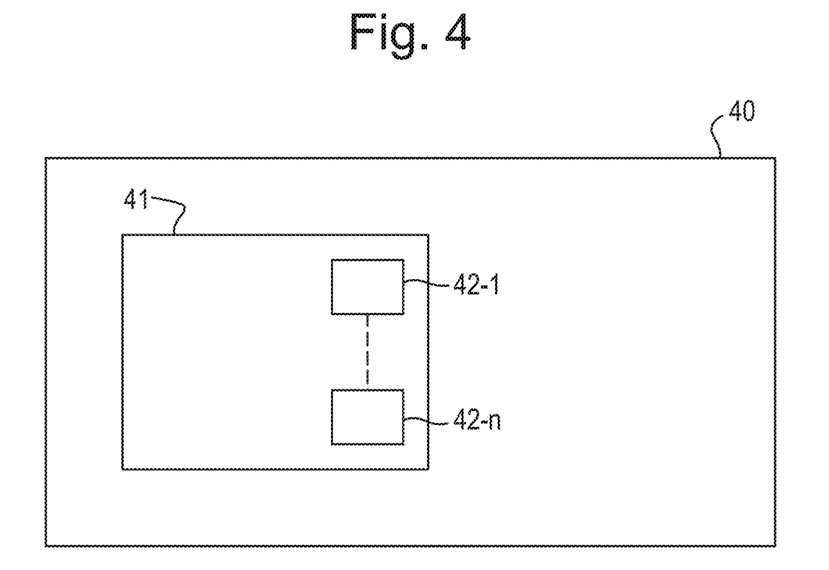
FIG. 4 shows schematically an aircraft including a monitoring system according to embodiments.

The architectures described herein may be particularly suited for use in aircraft control systems. FIG. 4 is a high level block diagram showing an example of a monitoring system 41 including one or more FPGAs 42-1, . . . , 42-n of the type described herein installed within an aircraft 40. For example, the monitoring system may comprise a monitoring system substantially as described in relation to either FIG. 2 or FIG. 3. Other arrangements would of course be possible.

Although the present disclosure has been described with reference to various embodiments, it will be understood by those skilled in the art that various changes in form and detail may be made without departing from the scope of the invention as set forth in the accompanying claims.

The invention claimed is:

1. A field programmable gate array (FPGA) having at least first and second processing circuits implemented thereon, wherein each of the first and second processing circuits comprises a numerical core and associated peripheral components, wherein the numerical core in the first processing circuit is dissimilar to the numerical core in the second processing circuit, and wherein the first and second processing circuits are segregated from each other in floorplan view such that there is no internal communication between the circuits on the FPGA, wherein communication between the first and second processing circuits is made externally to the FPGA.

2. The FPGA of claim 1, wherein the first processing circuit includes a soft numerical core, and wherein the second processing circuit includes a hard coded numerical core.

3. The FPGA of claim 1, wherein the first and second processing circuits both include a soft numerical core.

4. The FPGA of claim 1, wherein the first and second processing circuits are implemented on different areas of a single substrate defining the FPGA.

5. The FPGA of claim 1, wherein each processing circuit further comprises one or more of: (i) a serial interface; (ii) an external memory interface; (iii) an external bus interface; (iv) a general purpose input/output module; and (v) a power bridge controller.

6. A method of operating the field programmable gate array (FPGA) of claim 1, comprising:
 transmitting data to at least one of the numerical cores; and
 for each numerical core to which data has been transmitted, performing an operation using the numerical core independently of the at least one other numerical core; and outputting data from each numerical core to which data has been transmitted.

7. The method of claim 6, wherein the transmitted data comprises a sensor measurement.

8. A monitoring system comprising:
 one or more FPGA(s) in accordance with claim 1.

9. The monitoring system of claim 8 in combination with an aircraft control system.

10. The FPGA of claim 1 in combination with an aircraft control system.

11. A method of designing or manufacturing a field programmable gate array (FPGA), the method comprising:
 providing a first processing circuit comprising a first numerical core and associated peripheral components;
 providing a second processing circuit comprising a second numerical core and associated peripheral components, wherein the second numerical core is dissimilar to the first numerical core; and
 arranging the first and second processing circuits on the FPGA such that the first and second processing circuits are segregated from one another in floorplan view and such that there is no internal communication between the circuits on the FPGA, wherein the first and second processing circuits are arranged such that communication between the first and second processing circuits is made externally to the FPGA.

* * * * *